US007443024B2

(12) United States Patent
Hong et al.

(10) Patent No.: US 7,443,024 B2
(45) Date of Patent: Oct. 28, 2008

(54) MICRO-ELECTRO-MECHANICAL SYSTEM (MEMS) PACKAGE HAVING SIDE DOUBLE-SEALING MEMBER AND METHOD OF MANUFACTURING THE SAME

(75) Inventors: Suk Kee Hong, Seoul (KR); Dong Hyun Park, Seoul (KR); Yeong Gyu Lee, Gyeonggi-do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 183 days.

(21) Appl. No.: 11/180,302

(22) Filed: Jul. 12, 2005

(65) Prior Publication Data

US 2006/0081951 A1    Apr. 20, 2006

(30) Foreign Application Priority Data

Oct. 8, 2004    (KR) ...................... 10-2004-0080501

(51) Int. Cl.
*H01L 23/10* (2006.01)
(52) U.S. Cl. ...................... 257/710; 257/433; 257/434; 257/704; 257/E23.127; 257/E23.193
(58) Field of Classification Search ......... 257/432–434, 257/704, 710, E23.126, E23.127, E23.18, 257/E23.193
See application file for complete search history.

(56) References Cited

U.S. PATENT DOCUMENTS 5,641,984 A * 6/1997 Aftergut et al. ............. 257/433

| | | | |
|---|---|---|---|
| 6,303,986 B1 | 10/2001 | Shook | |
| 2003/0143423 A1* | 7/2003 | McCormick et al. | 428/690 |
| 2005/0202591 A1* | 9/2005 | Chen et al. | 438/106 |

* cited by examiner

*Primary Examiner*—Matthew E Warren
(74) *Attorney, Agent, or Firm*—Christensen O'Connor Johnson Kindness PLLC

(57) ABSTRACT

A micro-electro-mechanical system (MEMS) package having a side double-sealing member and method of manufacturing the MEMS package is disclosed. The MEMS package is formed by forming a metal layer on a base substrate by patterning so that the metal layer surrounds an MEMS element provided on the base substrate, joining a lid glass to the metal layer, and providing a side double-sealing member on a surface of the base substrate and a side surface of the lid glass, thus hermetically sealing the MEMS element from the external environment. The MEMS package includes a base substrate, with an MEMS element provided on a surface of the base substrate; a lid glass joined to the base substrate such that the lid glass covers the MEMS element and transmits incident light; a dam sealing member provided on a surface of the base substrate and a side surface of the lid glass, thus hermetically sealing the MEMS element from the external environment; and a second sealing member deposited on an upper surface of the dam sealing member such that the second sealing member is provided on the surface of the base substrate and the side surface of the lid glass, thus secondarily hermetically sealing the MEMS element from the external environment.

6 Claims, 4 Drawing Sheets

MICRO-ELECTRO-MECHANICAL SYSTEM (MEMS) PACKAGE HAVING SIDE DOUBLE-SEALING MEMBER AND METHOD OF MANUFACTURING THE SAME

BACKGROUND OF THE INVENTION

1. Field of the Invention

The present invention relates, in general, to micro-electro-mechanical system (MEMS) packages with side double-sealing members and methods of manufacturing the MEMS packages and, more particularly, to an MEMS package having a side double-sealing member and method of manufacturing the MEMS package, in which an MEMS element provided on a base substrate is hermetically sealed from the external environment by forming a metal layer on the base substrate by patterning so that the metal layer surrounds the MEMS element, joining a lid glass to the metal layer, and providing the side double-sealing member on a surface of the base substrate and a side surface of the lid glass.

2. Description of the Related Art

In recent years, high-capacity communications for broadband service, such as in the Internet or the IMT 2000, have become powerful, so that optical communication techniques including, for example, WDM (wavelength division multiplexing), have been quickly standardized. In relation to the standardization of the optical communication technique, MEMS, which does not depend on wave-length, data rate or signal format and thereby has characteristics of being "optically transparent", has been proposed and recognized as an innovative technique to supplant electronics, which can accomplish the recent trend of system smallness.

In the related art, current applications of MEMS are accelerometers, pressure sensors, inkjet heads, hard disk heads, projection displays, scanners and micro-fluidics. In recent years, interest in the techniques of optical communication elements, having higher operational performance to meet the rapid development in the optical communications field, has increased.

Particularly, the interest in the techniques of the optical communication elements is concentrated on spatial light modulators, which have a great number of micromirrors and operate in a specified switching manner such that the micromirrors are actuated by MEMS type actuators. The spatial light modulators use an optical signal processing technique with advantages in that a great amount of data can be quickly processed in a parallel manner, unlike a conventional digital information processing technique, in which a great amount of data cannot be processed in real time.

Thus, studies have been actively conducted on the design and production of binary phase only filters, optical logic gates, light amplifiers, image processing techniques, optical devices, and light modulators using the spatial light modulation theory. Of them, the spatial light modulators are applied to fields relating to optical memory units, optical display devices, printers, optical interconnections, and holograms, and studies have been conducted to develop display devices employing the spatial display modulators.

However, the MEMS elements have ultra-fine actuators so that the MEMS elements are greatly sensitive to the external environment, including temperature, humidity, micro-dust, vibration and impact, and thereby may frequently commit errors during operation, or may suddenly stop operating.

In an effort to allow the MEMS elements to effectively operate without being negatively affected by the environment, the MEMS elements have been sealed in cavities of sealed packages. U.S. Pat. No. 6,303,986 discloses a method and apparatus for sealing MEMS elements using a hermetic lid to provide an MEMS package.

Herein below, the construction of the MEMS package disclosed in U.S. Pat. No. 6,303,986, in which the lid glass hermetically seals the MEMS elements from the external environment, will be described with reference to FIG. 1.

FIG. 1 shows a representative sectional view of the MEMS package in which the transparent lid hermetically seals the MEMS element. As shown in FIG. 1, a conductive ribbon 100 having a metallic conductive/reflective covering 102 is formed over an upper surface of a semiconductor substrate 104, with an air gap 106 defined between the ribbon 100 and the substrate 104.

A conductive electrode 108 is formed on the upper surface of the substrate 104 and covered with an insulation layer 110. The conductive electrode 108 is placed under the ribbon 100 at a position under the air gap 106.

The conductive/reflective covering 102 extends beyond the region of the mechanically active ribbon 100 and is configured as a bond pad 112 at its distal end. The MEMS package is also passivated with a conventional overlying insulating passivation layer 114 which does not cover the bond pads 112 or the ribbon structures 100 and 102.

Control and power signals are coupled to the MEMS package using conventional wire-bonding structures 116.

Unlike conventional semiconductor manufacturing techniques in which semiconductor elements are packed densely onto the upper surface of a semiconductor substrate, an optical glass is hermetically sealed directly onto the semiconductor substrate in the above-mentioned U.S. patent. Thus, the bond pads 112 are spaced a considerable distance from the ribbon structures 100 and 102, so that a lid sealing region 118 is provided. A solderable material 120 is formed on the lid sealing region 118.

The hermetic lid 122, which is joined to the semiconductor substrate, is preferably formed of an optical quality material. Thus, the lid 122 can be used for a variety of purposes including filtering undesired radiation and enhancing or decreasing reflectivity.

The lid 122 may be also coated with an optically sensitive material to be used for other purposes without being limited to the above-mentioned purposes.

Once the lid 122 is formed to a size appropriate to fit concurrently over the lid sealing region 118, with a solderable material 124 formed in a ring surrounding the periphery of one surface of the lid 122, solder 126 is deposited onto the solderable material 124 so that the lid 122 is joined to the semiconductor substrate.

Though not shown to scale in the drawing, a significant space exists between the lid 122 and the ribbon structures 100 and 102 to prevent them from interfering with one another. Thus, the ribbon structures 100 and 102 are free to move upwards and downwards.

However, in the above-mentioned conventional technique of sealing the semiconductor elements in the above-mentioned MEMS package, the solder must be placed between the substrate and the lid and, thereafter, heat must be applied to the solder through a reflow process at a predetermined temperature so as to bond the lid to the substrate. Thus, the technique undesirably reduces the work speed, causing a reduction in productivity.

Another problem of the technique of sealing the semiconductor elements in the MEMS package is that it is impossible to execute a reworking process, such as for adding solder, even when the sealing is not complete due to inaccurate positioning of the solder and/or application of a deficient amount of solder to the junction between the substrate and the lid.

In an effort to solve the above-mentioned problems encountered in the conventional technique of sealing the semiconductor elements in the MEMS packages, Korean Patent Application No. 2004-035634 proposed an MEMS package having a side sealing member and a method of manufacturing the MEMS package.

SUMMARY OF THE INVENTION

Accordingly, the present invention has been made keeping in mind the above problems occurring in the related art, and an object of the present invention is to provide an MEMS package, in which a side double-sealing member is formed on a surface of a base substrate and a side surface of a lid glass that covers an MEMS element provided on the base substrate, so that the side double-sealing member hermetically seals the MEMS element from the external environment.

In order to achieve the above object, according to one aspect of the present invention, there is provided an MEMS package having a side double-sealing member, comprising: a base substrate, with an MEMS element provided on a surface of the base substrate; a lid glass joined to the base substrate such that the lid glass covers the MEMS element and transmits incident light; a dam sealing member provided on a surface of the base substrate and a side surface of the lid glass, thus hermetically sealing the MEMS element from the external environment; and a second sealing member deposited on an upper surface of the dam sealing member such that the second sealing member is provided on the surface of the base substrate and the side surface of the lid glass, thus secondarily hermetically sealing the MEMS element from the external environment.

According to another aspect of the present invention, there is provided a method of manufacturing an MEMS package having a side double-sealing member, comprising: providing an MEMS element on a surface of the base substrate; joining a lid glass to the base substrate; forming a dam sealing member on a surface of the base substrate and a side surface of the lid glass; and forming a second sealing member on an upper surface of the dam sealing member.

According to a further aspect of the present invention, there is provided a method of manufacturing an MEMS package having a side double-sealing member, comprising: providing an MEMS element on a surface of the base substrate; joining a lid glass to the base substrate by forming a dam sealing member which is made of an anisotropic conductive film (ACF)-type adhesive; and forming a second sealing member on an upper surface of the dam sealing member.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Herein below, an MEMS package with a metal sealing member according to the present invention will be described in detail with reference to the accompanying drawings.

Figure 1:
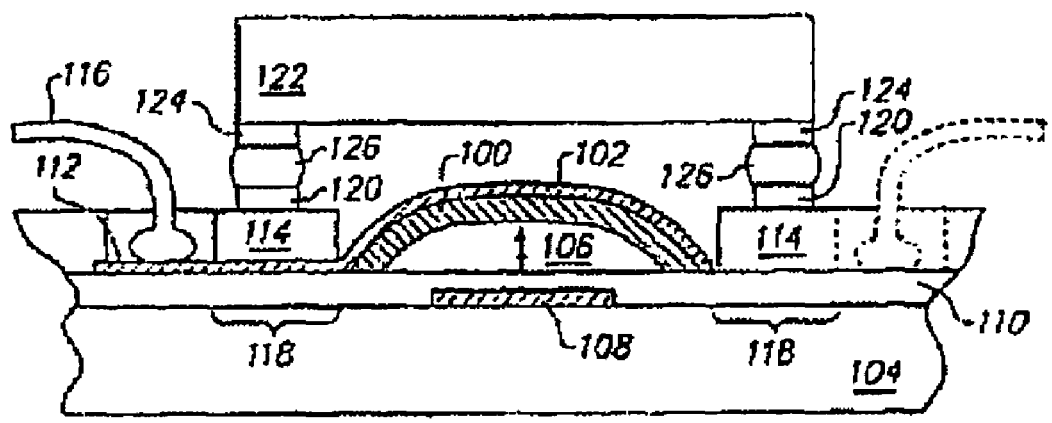
FIG. 1 is a sectional view illustrating the construction of an MEMS package according to a conventional technique.
Figure 2A:
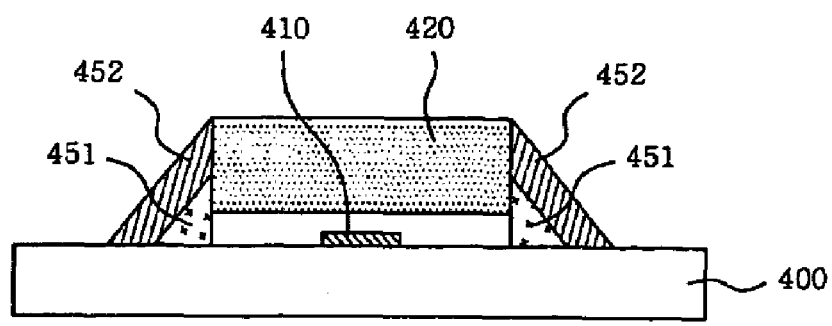
FIG. 2A is a sectional view illustrating the construction of an MEMS package having a side double-sealing member according to a first embodiment of the present invention.

FIG. 2A is a sectional view illustrating the construction of an MEMS package having a side double-sealing member according to a first embodiment of the present invention.

As shown in the drawing, the MEMS package having a side double-sealing member according to the first embodiment of the present invention comprises a side double-sealing member 451, 452, which is formed on a side surface of a lid glass 420 that covers an MEMS element 410 provided on a surface of a base substrate 400, thus hermetically sealing the MEMS element 410 from the external environment. The MEMS package comprises the base substrate 400 on which the MEMS element 410 is provided, the lid glass 420, and the side double-sealing member 451, 452.

In the first embodiment, the base substrate 400 may be a semiconductor substrate on which an MEMS element is formed, or a conventional printed circuit board (PCB) to which an MEMS element is mounted through a bonding process and which thus functions as a medium. The above-mentioned base substrate 400 is provided with a bond pad (not shown) to which a wire (not shown) to transceive electric signals to and from the outside of the package is connected.

In that case, examples of MEMS elements 310 are diffractive, reflective or transmissive light modulating elements, optical elements or display elements used in a variety of optical devices, such as optical memory units, optical displays, printers, optical interconnections, and hologram displays.

The lid glass 420 may be coated on one or both sides thereof with an antireflective (AR) coating so that incident light transmissibility of the lid glass 420 can be enhanced.

The side double-sealing member 451, 452 functions as a sealing means for sealing the MEMS element 410, provided on the base substrate 400, from the external environment. Thus, the side double-sealing member 451, 452 is provided on a surface of the base substrate 400 and a side surface of the lid glass 420. To hermetically and reliably seal the MEMS element 410 from the external environment, the side double-sealing member 451, 452 is configured as a double-layered structure.

Described in detail, the side double-sealing member 451, 452 comprises two layers: an inside layer which forms a dam sealing member 451 and an outside layer which forms a second sealing member 452. The dam sealing member 451 which is the inside layer functions as a dam which prevents the second sealing member 452 from flowing into the MEMS moving space of the MEMS package. The second sealing member 452 which is the outside layer functions as a sealing means which completely and hermetically seals the MEMS element 410 from the external environment.

In the first embodiment, the dam sealing member 451, which is the inside layer preventing the second sealing member 452 from flowing into the MEMS moving space of the MEMS package, is made of a material which has low sealing efficiency and low adhesive power. For example, the material of the dam sealing member 451 may be a high viscosity silicone- or gel-type silicone-based material free from resin bleed out.

Unlike the dam sealing member 451, the second sealing member 452 which is the outside layer must completely and hermetically seal the MEMS element 410 from the external environment, so that the second sealing member 452 is made of a material which has high sealing efficiency and high adhesive power. However, the material of the second sealing member 452 has low viscosity, so that, if there is no dam sealing member 451 in the MEMS package, the second sealing member 452 may flow into the MEMS moving space. The material of the second sealing member 452 may be an epoxy- or silicone-based material.

The properties of the dam sealing material 451 and the second sealing material 452 are given in the following Table 1.

TABLE 1

|  | Dam sealing member | Second sealing member |
|---|---|---|
| Outgas | Less amount | Large amount |
| Air-tightness | Bad | Good |
| Resin bleed out | Not bleed | Much bleed |
| Viscosity | High | Low |
| Sealing efficiency | Low | High |
| Adhesive power | Low | High |
| Thermal conductivity | High | Low |
| Thermal expansion | Low | High |
| Examples of usable materials for the sealing members | High viscosity silicone, Gel-type silicone or epoxy | Epoxy, Silicone, Liquid materials deposited through electrolytic plating or sputtering |

Figure 2B:
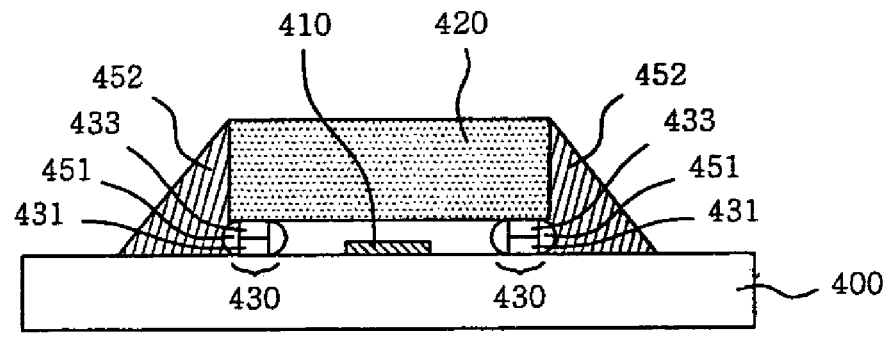
FIG. 2B is a sectional view illustrating the construction of an MEMS package having a side double-sealing member according to a second embodiment of the present invention.

FIG. 2B is a sectional view illustrating the construction of an MEMS package having a side double-sealing member according to a second embodiment of the present invention.

As shown in the drawing, the MEMS package having a side double-sealing member according to the second embodiment of the present invention comprises a side double-sealing member 451, 452, which is formed on a side surface of a lid glass 420 that covers an MEMS element 410 provided on a surface of a base substrate 400, thus hermetically sealing the MEMS element 410 from the external environment. The MEMS package comprises the base substrate 400 on which the MEMS element 410 is provided, a lower bump 431, an upper bump 433, the lid glass 420, and the side double-sealing member 451, 452.

In the first embodiment, the base substrate 400 may be a semiconductor substrate on which an MEMS element is formed, or a conventional printed circuit board (PCB) on which an MEMS element is mounted through a bonding process and which thus functions as a medium. The above-mentioned base substrate 400 is provided with a bond pad (not shown) to which a wire (not shown) to transceive electric signals to and from the outside of the package is connected.

The lower bump 431 formed on a lid sealing region 430 of the base substrate 400 joins a dam sealing member 451, which is an inside layer of the side double-sealing member 451, 452 as will be described in detail later herein, to the base substrate 400. The upper bump 433 formed around the periphery of a lower surface of lid glass 420 joins the dam sealing member 451 to the lid glass 420.

The dam sealing member 451 which is the inside layer of the side double-sealing member 451, 452 is a material shaped as an anisotropic conductive film (ACF), and joins the lower bump 431 and the upper bump 433 together. Furthermore, the dam sealing member 451 prevents a second sealing member 452, which is an outside layer of the side-double-sealing member 451, 452 as will be described in detail later herein, from flowing into the MEMS moving space.

The lid glass 420 is joined to the base substrate 400 using the dam sealing member 451, and protects the MEMS element 410 provided on the base substrate 400 from the external environment, including humidity and dust.

The side double-sealing member 451, 452 functions as a sealing means for sealing the MEMS element 410 provided on the base substrate 400 from the external environment. Thus, the side double-sealing member 451, 452 is provided on a surface of the base substrate 400 and a side surface of the lid glass 420. To hermetically and reliably seal the MEMS element 410 from the external environment, the side double-sealing member 451, 452 is configured as a double-layered structure.

Described in detail, the side double-sealing member 451, 452 comprises two layers: an inside layer which forms the dam sealing member 451 and an outside layer which forms the second sealing member 452. As described above, the dam sealing member 451 which is the inside layer of the side double-sealing member 451, 452 is a material shaped as an anisotropic conductive film (ACF), joins the lower bump 431 and the upper bump 433 together, and, furthermore, prevents the second sealing member 452, which is the outside layer of the side-double-sealing member 451, 452, from flowing into the MEMS moving space. The second sealing member 452 completely and hermetically seals the MEMS element 410 from the external environment.

In other words, the dam sealing member 451, which is the inside layer, functions as a dam which prevents the second sealing member 452 from flowing into the MEMS moving space of the MEMS package. The material of the dam sealing member 451 has low sealing efficiency and low adhesive power.

Unlike the dam sealing member 451, the second sealing member 452 is made of a material having high sealing efficiency and high adhesive power because the second sealing member 452 must completely and hermetically seal the MEMS element 410 from the external environment. Thus, if there is no dam sealing member 451 in the MEMS package, the second sealing member 452 may flow into the MEMS moving space.

Figure 3A:
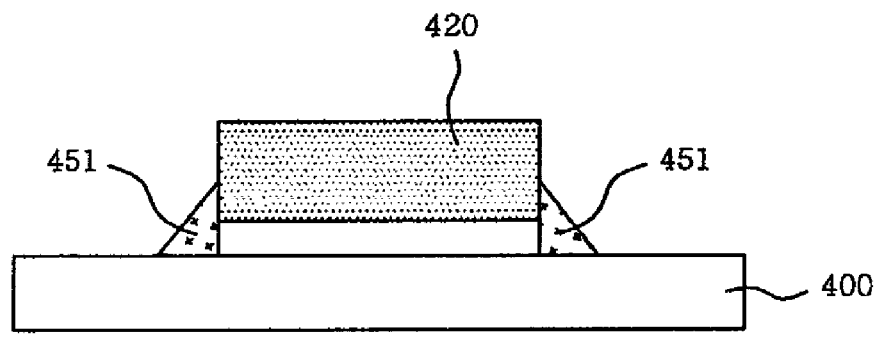
FIGS. 3A and 3B are sectional views illustrating a process of manufacturing the MEMS package having the side double-sealing member according to the first embodiment of the present invention.
Figure 3B:
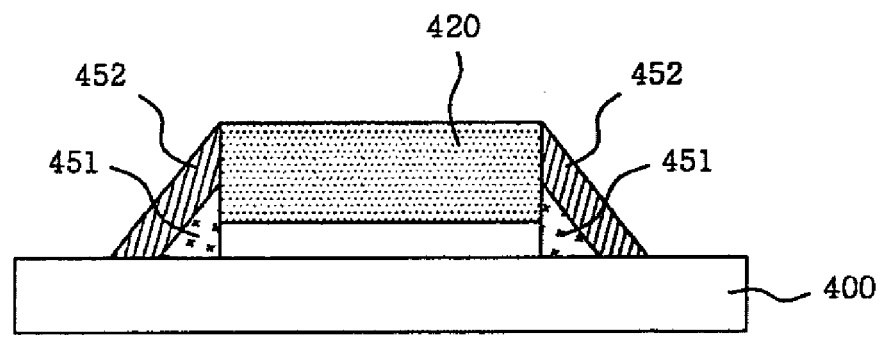

FIGS. 3A and 3B are sectional views illustrating a process of manufacturing the MEMS package having the side double-sealing member according to the first embodiment of the present invention.

To manufacture the MEMS package according to the first embodiment of the present invention, the light transmissive lid 420 is aligned with the base substrate 400 such that the lid 420 is in contact with the base substrate 400 as shown in FIG. 3A. Thereafter, the dam sealing member 451 to prevent the second sealing member 452 from flowing into the MEMS moving space is formed on a surface of the substrate 400 and a side surface of the light transmissive lid 420.

Thereafter, the second sealing member 452 is formed on the upper surface of the dam sealing member 451 as shown in FIG. 3B, thus hermetically sealing the MEMS element 410.

FIGS. 4A through 4D are sectional views illustrating a process of manufacturing the MEMS package having the side double-sealing member according to the second embodiment of the present invention.

Figure 4A:
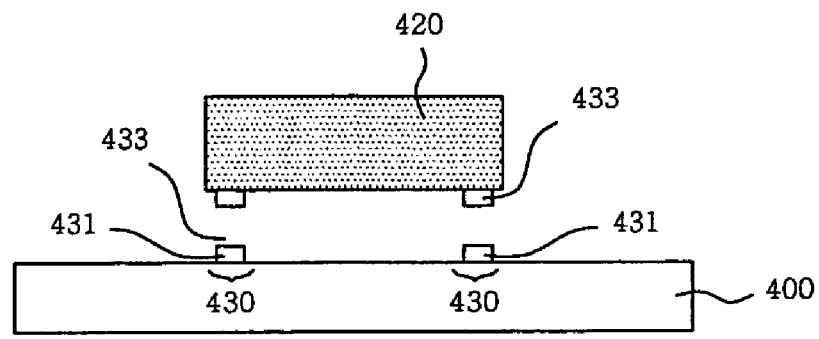
FIGS. 4A through 4D are sectional views illustrating a process of manufacturing the MEMS package having the side double-sealing member according to the second embodiment of the present invention.
Figure 4B:
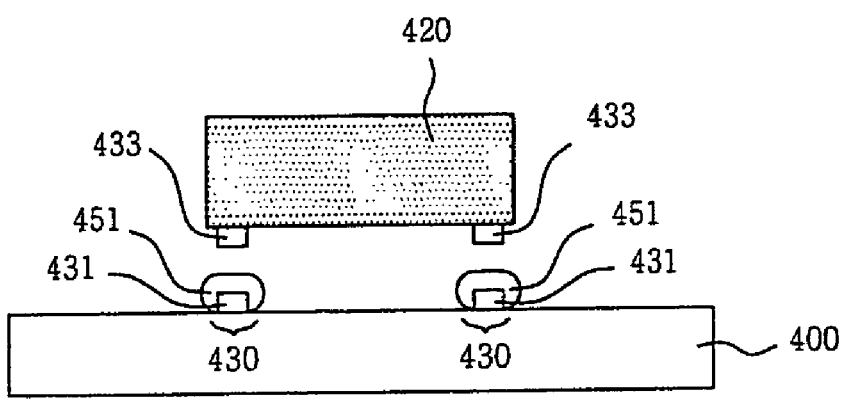

To manufacture the MEMS package according to the second embodiment of the present invention, the lower bump 431 is formed on the lid sealing region 430 of the base substrate 400, while the upper bump 433 is formed around the periphery of a lower surface of lid glass 420, as shown in FIG. 4A. Thereafter, an ACF material 451 is coated on the lower bump 431 as shown in FIG. 4B.

Figure 4C:
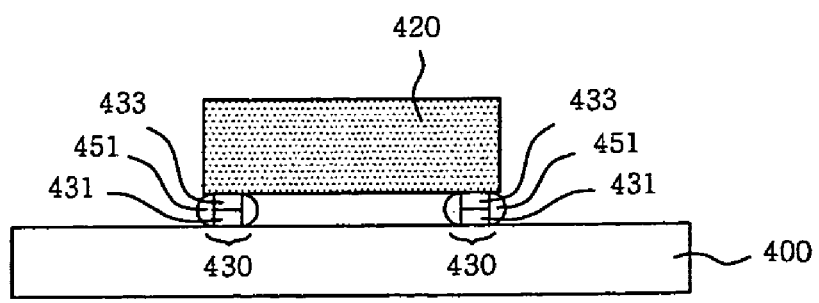

The light transmissive lid 420 is aligned with the base substrate 400 such that the lid 420 is in contact with the base substrate 400, as shown in FIG. 4C. Thereafter, the ACF material 451 is heated so that the material 451 is fused.

In the above state, the ACF material 451 is heated for a lengthy period of time such that the ACF material 451 flows over the entire surface of the lower bump 431. Thereafter, the ACF material 451 is cooled so that the ACF material 451 is resolidified, thus joining the light transmissive lid 410 and the base substrate 400 together while sealing the MEMS moving space from the outside. The resolidified ACF material 451 forms a dam sealing member which functions as a dam to prevent the second sealing member 452 from flowing into the MEMS moving space during formation of the second sealing member 452 on the MEMS package.

Figure 4D:
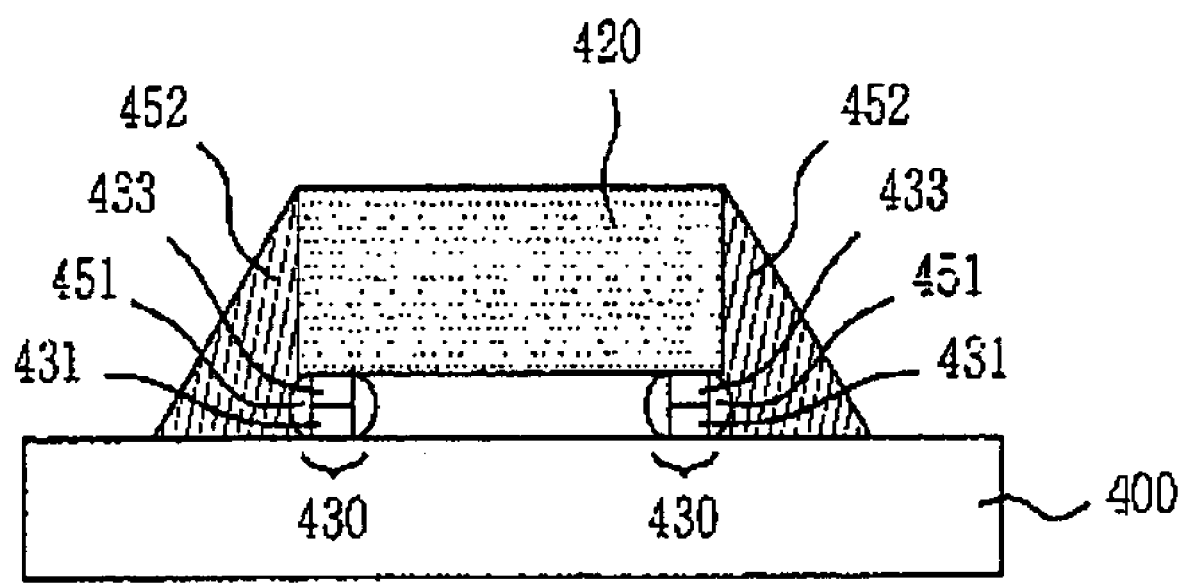

Thereafter, the second sealing member 452 is formed on the upper surface of the dam sealing member 451 as shown in FIG. 4D, thus completely and hermetically sealing the MEMS element 410 from the external environment.

As is apparent from the above description, the MEMS package according to the present invention completely and hermetically seals an MEMS element from the external environment using epoxy.

Furthermore, in the MEMS package of the present invention, a dam sealing member prevents the epoxy of a second sealing member from flowing into an MEMS moving space of the package during formation of the second sealing member.

In addition, the present invention uses a sealing material having high sealing efficiency and high adhesive power as the material for the side sealing member, regardless of viscosity and resin bleed out of the sealing material.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A micro-electro-mechanical system (MEMS) package having a side double-sealing member, comprising:
    a base substrate, with an MEMS element provided on a surface of the base substrate;
    a light transmissive lid joined to the base substrate such that the lid covers the MEMS element and cooperates with the substrate to create a hollow cavity for the MEMS element, the lid also allows light to travel into and out of the cavity, said lid having a side surface portion extending around the perimeter of the lid;
    a dam sealing member provided on a space defined between the surface of the base substrate and the side surface of the light transmissive lid to extend substantially around the entire perimeter of the side surface of the lid, thereby to overlap the side surface portion of the lid and thus hermetically sealing the MEMS element from the external environment; and
    a second sealing member deposited on an exterior surface of the dam sealing member such that the second sealing member extends from the surface of the base substrate and substantially around the entire perimeter of the side surface of the lid, thus secondarily hermetically sealing the MEMS element from the external environment.

2. The MEMS package as set forth in claim 1, wherein the dam sealing member is made of a high viscosity silicone- or gel-type silicone-based material.

3. The MEMS package as set forth in claim 1, wherein the second sealing member is made of an epoxy- or silicone-based material.

4. The MEMS package as set forth in claim 1, wherein the dam sealing member is shaped as an anisotropic conductive film (ACF).

5. The MEMS package as set forth in claim 1, wherein the lid is composed of glass.

6. The MEMS package as set forth in claim 1, wherein the MEMS element is a diffractive light modulating element.

* * * * *